United States Patent
Lee

(10) Patent No.: US 12,057,428 B2
(45) Date of Patent: *Aug. 6, 2024

(54) WIRE BONDING APPARATUS

(71) Applicant: SAMSUNG ELECTRONICS CO., LTD., Suwon-si (KR)

(72) Inventor: Jongeun Lee, Cheonan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 18/060,012

(22) Filed: Nov. 30, 2022

(65) Prior Publication Data

US 2023/0086643 A1  Mar. 23, 2023

Related U.S. Application Data

(63) Continuation of application No. 17/193,542, filed on Mar. 5, 2021, now Pat. No. 11,521,949.

(30) Foreign Application Priority Data

Jul. 10, 2020 (KR) ................. 10-2020-0085207

(51) Int. Cl.
*B23K 20/00* (2006.01)
*B23K 3/06* (2006.01)
(Continued)

(52) U.S. Cl.
CPC ............ *H01L 24/78* (2013.01); *B23K 3/063* (2013.01); *B23K 20/005* (2013.01); *B23K 2101/40* (2018.08); *H01L 2224/78621* (2013.01)

(58) Field of Classification Search
CPC ....... H01L 24/43; H01L 23/525; H01L 24/45; H01L 24/78; H01L 2224/78621;
(Continued)

(56) References Cited

U.S. PATENT DOCUMENTS 4,337,573 A   7/1982 Nicolas et al.
4,976,392 A   12/1990 Smith et al.
(Continued)

FOREIGN PATENT DOCUMENTS

CN    1367063 A  *  9/2002  ............... B08B 1/04
CN    1551321 A  *  12/2004 ........... B23K 20/004
(Continued)

*Primary Examiner* — Kiley S Stoner
(74) *Attorney, Agent, or Firm* — F. CHAU & ASSOCIATES, LLC

(57) ABSTRACT

A wire bonding includes a capillary that extrudes a wire; a wire clamp assembly disposed on the capillary; a support disposed on the wire clamp assembly; a wire contact member; and a slide rail that provides a slide hole. The wire clamp assembly includes: a first member; a second member spaced apart from the first member; a first contact member coupled to the first member; and a second contact member coupled to the second member and spaced apart from the first contact member. The first member includes a first body that extends in a first direction and a first tilting member that extends at an acute angle relative to the first direction. The second member includes a second body that extends in the first direction and is spaced apart from the first body in a second direction a second tilting member.

13 Claims, 20 Drawing Sheets

(51) Int. Cl.
*H01L 23/00* (2006.01)
*B23K 101/40* (2006.01)

(58) Field of Classification Search
CPC ......... H01L 24/05; H01L 24/06; H01L 24/48;
H01L 24/85; H01L 2224/05554; H01L
2224/06135; H01L 2224/48091; H01L
2224/48227; H01L 2224/78301; H01L
2224/78601; H01L 2224/78611; H01L
2224/85181; H01L 2924/00014; H01L
2924/10161; B23K 20/004; B23K 20/007;
B23K 3/063; B23K 20/005; B23K
2101/40; B23K 2101/36
USPC ....................................... 228/4.5, 180.5, 904
See application file for complete search history.

(56) References Cited

U.S. PATENT DOCUMENTS

| | | | |
|---|---|---|---|
| 5,931,452 A | 8/1999 | Nakatomi et al. | |
| 6,173,879 B1 | 1/2001 | Chiba | |
| 6,513,696 B1 | 2/2003 | Ho et al. | |
| 6,533,158 B2 | 3/2003 | Oishi et al. | |
| 7,841,505 B2 | 11/2010 | Lee et al. | |
| 9,498,851 B2 | 11/2016 | Lin et al. | |
| 9,502,374 B2 | 11/2016 | Song et al. | |
| 9,889,521 B2 | 2/2018 | Song et al. | |
| 10,014,644 B2 | 7/2018 | Eggimann et al. | |
| 2004/0232203 A1 | 11/2004 | Gaunekar et al. | |
| 2005/0199677 A1 | 9/2005 | Sadler et al. | |
| 2008/0302857 A1 | 12/2008 | Felber | |
| 2013/0200134 A1 | 8/2013 | Byars | |
| 2015/0128405 A1 | 5/2015 | Zhang et al. | |
| 2019/0279957 A1 | 9/2019 | Uchida et al. | |
| 2021/0094118 A1 | 4/2021 | Chen et al. | |
| 2022/0013491 A1 | 1/2022 | Lee | |

FOREIGN PATENT DOCUMENTS

| | | | | |
|---|---|---|---|---|
| CN | 105665862 A | * | 6/2016 | |
| CN | 108044218 A | * | 5/2018 | ............... B23K 3/00 |
| DE | 4326478 | | 1/1995 | |
| JP | 56087335 | | 7/1981 | |
| JP | 60053038 | | 3/1985 | |
| JP | 01028929 | | 1/1989 | |
| JP | 2002-368035 | | 12/2002 | |
| JP | 2011-086858 | | 4/2011 | |
| JP | 6654304 | | 2/2020 | |
| KR | 10-0585600 | | 6/2006 | |
| KR | 10-1409460 | | 6/2014 | |
| KR | 20190046943 A | * | 5/2019 | |
| WO | WO-2016103886 A1 | * | 6/2016 | ........... B23K 20/002 |

* cited by examiner

WIRE BONDING APPARATUS

CROSS-REFERENCE TO RELATED APPLICATIONS

This application is a continuation application of U.S. application Ser. No. 17/193,542, filed on Mar. 5, 2021, which claims priority under 35 U.S.C. § 119 to Korean Patent Application No. 10-2020-0085207 filed on Jul. 10, 2020 in the Korean Intellectual Property Office, and the disclosures of the above referenced applications are incorporated by reference herein in their entirety.

TECHNICAL FIELD

Example embodiments relate generally to a wire bonding apparatus, and more particularly, to a wire bonding apparatus capable of suppressing swinging movement of wires.

DISCUSSION OF RELATED ART

A semiconductor package includes an integrated circuit chip for use in electronic products. In general, the semiconductor package may be fabricated by mounting a semiconductor chip on a substrate such as a printed circuit board (PCB). A single semiconductor package may have a plurality of mounted semiconductor chips. The semiconductor package may be configured such that the semiconductor chip is electrically connected to the substrate. The connection between the semiconductor chip and the substrate may be achieved in various ways. For example, the semiconductor chip and the substrate may be electrically connected though a wire connected between a pad of the semiconductor chip and a pad of the substrate. A wire bonding apparatus may direct the wire to connect the pad of the semiconductor chip to the pad of the substrate.

SUMMARY

Some example embodiments of the present inventive concepts provide a wire bonding apparatus capable of suppressing swinging movement of wires.

Some example embodiments of the present inventive concepts provide a wire bonding apparatus capable of increasing a yield of wire bonding.

Some example embodiments of the present inventive concepts provide a wire bonding apparatus capable of increasing a yield of wire bonding performed at various angles.

According to some example embodiments of the present inventive concepts, a wire bonding apparatus may include: a capillary that extracts a wire; a wire clamp assembly on the capillary; and a support on the wire clamp assembly. The wire clamp assembly may include: a first member; a second member spaced apart from the first member; a first contact member coupled to the first member; and a second contact member coupled to the second member and spaced apart from the first contact member. The first member may include: a first body that extends in a first direction; and a first tilting member that makes an acute angle relative to the first direction. The second member may include: a second body that extends in the first direction and is spaced apart from the first body in a second direction intersecting the first direction; and a second tilting member that makes the acute angle relative to the first direction and is spaced apart from the first tilting member. The first contact member may be coupled to an inner surface of the first tilting member and may extend in an extending direction of the first tilting member. The second contact member may be coupled to an inner surface of the second tilting member and may extend in an extending direction of the second tilting member. The second member may be movable in the second direction.

According to some example embodiments of the present inventive concepts, a wire bonding apparatus may include: a capillary that extracts a wire; a wire clamp assembly on the capillary; and a driver that drives the wire clamp assembly to move in the first direction and a second direction intersecting the first direction. The wire clamp assembly may include: a first tilting member that makes an acute angle relative to the first direction; a second tilting member that makes the acute angle relative to the first direction and is spaced apart from the first tilting member; a first contact member coupled to an inner surface of the first tilting member; and a second contact member coupled to an inner surface of the second tilting member and spaced apart from the first contact member. The first contact member may extend in an extending direction of the first tilting member. The second contact member may extend in an extending direction of the second tilting member. The second tilting member may be movable in the second direction.

According to some example embodiments of the present inventive concepts, a wire bonding apparatus may include: a capillary that extracts a wire; a wire clamp assembly on the capillary; a support on the wire clamp assembly, the support providing a through hole; a driver that drives the wire clamp assembly to move in a first direction and a second direction intersecting the first direction; and a slide rail that provides a slide hole. The wire clamp assembly may include: a first member; a second member spaced apart from the first member; a first contact member coupled to the first member; and a second contact member coupled to the second member and spaced apart from the first contact member. The second member may be movable in the second direction. The slide hole may form an arc shape whose center is occupied by the through hole. The wire clamp assembly may be slidably coupled to the slide hole.

Details of other example embodiments are included in the description and drawings.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Figure 1:
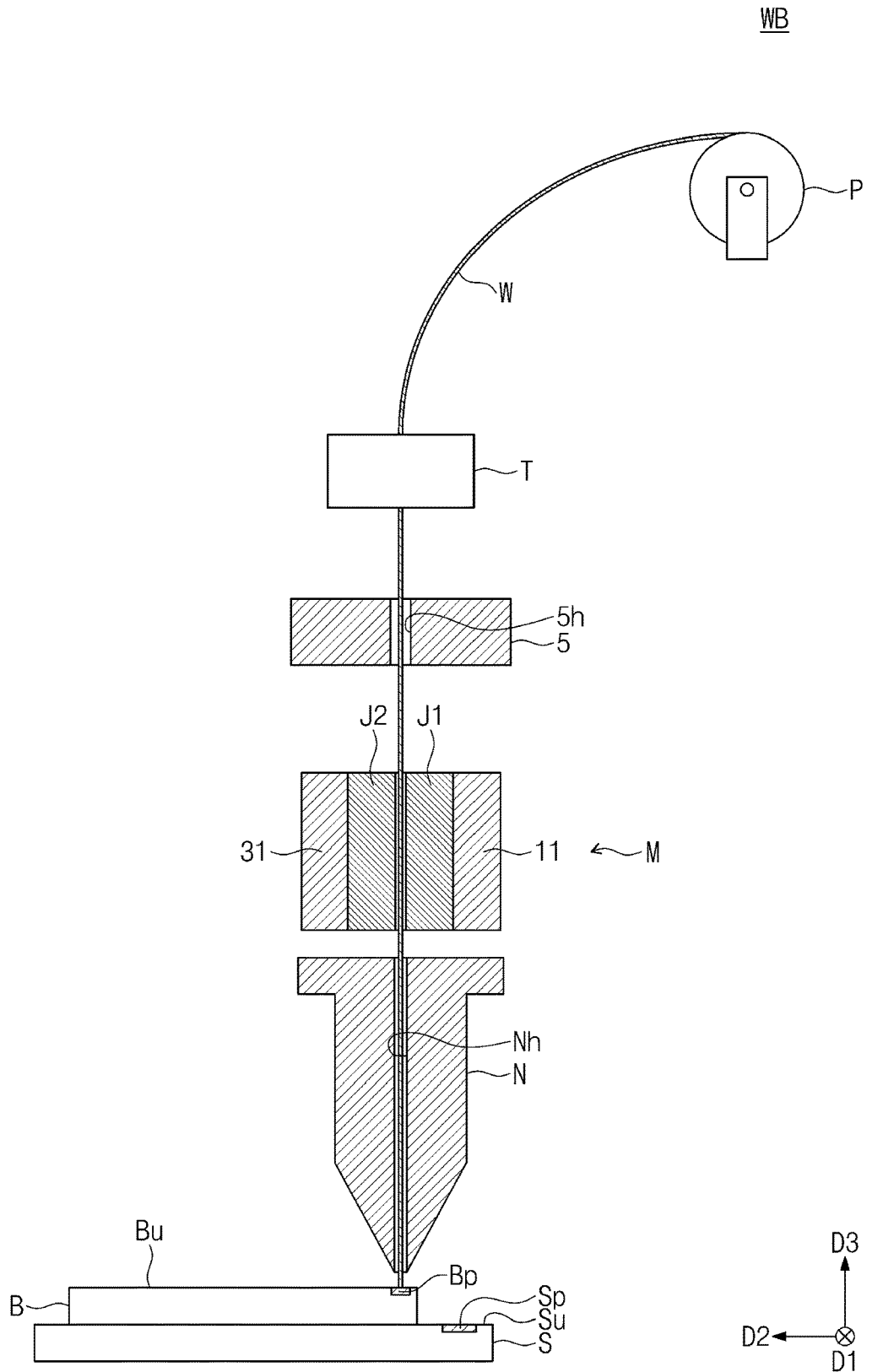
FIG. 1 illustrates a simplified diagram showing a cross-sectional view of a semiconductor package and a wire bonding apparatus according to some example embodiments of the present inventive concepts.

Example embodiments of the inventive concepts will now be described more fully with reference to the accompanying drawings, in which example embodiments are shown. Like reference numerals may indicate like components throughout the description.

FIG. 1 illustrates a simplified diagram showing a semiconductor package and a wire bonding apparatus according to some example embodiments of the present inventive concepts.

In description below, symbols D1, D2, and D3 of FIG. 1 may respectively be called a first direction, a second direction, and a third direction intersecting the first and second directions.

Referring to FIG. 1, a wire bonding apparatus WB may be used to perform wire bonding in semiconductor package fabrication. For example, the wire bonding apparatus WB may connect a substrate pad Sp exposed on a top surface Su of a substrate S to a chip pad Bp exposed on a top surface Bu of a semiconductor chip B. The wire bonding apparatus WB may include a wire spool P, a wire tensioner T, a support 5, a wire clamp assembly M, and a capillary N.

The wire spool P may store a wire W. For example, the wire W may be wound on the wire spool P. The wire W may be used to connect the substrate S and the semiconductor chip B to each other in a semiconductor package. The wire W may include a conductive material. For example, the wire W may include a metallic material. The wire W may electrically connect the chip pad Bp of the semiconductor chip B to the substrate pad Sp of the substrate S. The wire spool P may provide the wire W. For example, when the wire spool P rotates, the wire spool P may release the wire W toward the wire tensioner T.

The wire tensioner T may provide tension force to the wire W provided from the wire spool P. For example, the wire tensioner T may inject gas upwardly to provide the tension force to push the wire W upwardly. The wire tensioner T may pull the wire W positioned below the wire tensioner T.

The support 5 may be placed under the wire tensioner T. In some example embodiments, the support 5 may be coupled to the wire clamp assembly M. The support 5 may provide a through hole 5h through which the wire W passes. The support 5 may support the wire W. For example, the support 5 may prevent swinging movement of the wire W that has passed through the wire tensioner T.

The wire clamp assembly M may be positioned under the support 5. The wire clamp assembly M may include a first tilting member 11, a second tilting member 31, a first contact member J1, and a second contact member J2. The wire W may pass through between the first contact member J1 and the second contact member J2. The second tilting member 31 and the second contact member J2 may move toward the first tilting member 11 and the first contact member J1. Accordingly, the wire clamp assembly M may compress the wire W at opposite sides. A detailed description thereof will be further discussed below.

The capillary N may be placed under the wire clamp assembly M. The capillary N may provide an extrusion hole Nh. The capillary N may extrude the wire W. For example, the capillary N may downwardly extrude the wire W that has passed through the wire claim assembly M. The capillary N may extrude the wire W toward the chip pad Bp. The capillary N may direct the wire W to contact the chip pad Bp, and thus the wire W and the chip pad Bp may be bonded to each other. For example, a separate tool may partially melt the wire W to bond the wire W to the chip pad Bp. During the bonding of the wire W, the wire clamp assembly M may compress and fix the wire W. For example, a lower portion of the wire W may be bonded to the chip pad Bp while the wire clamp assembly M fixes an upper portion of the wire W.

Figure 2:
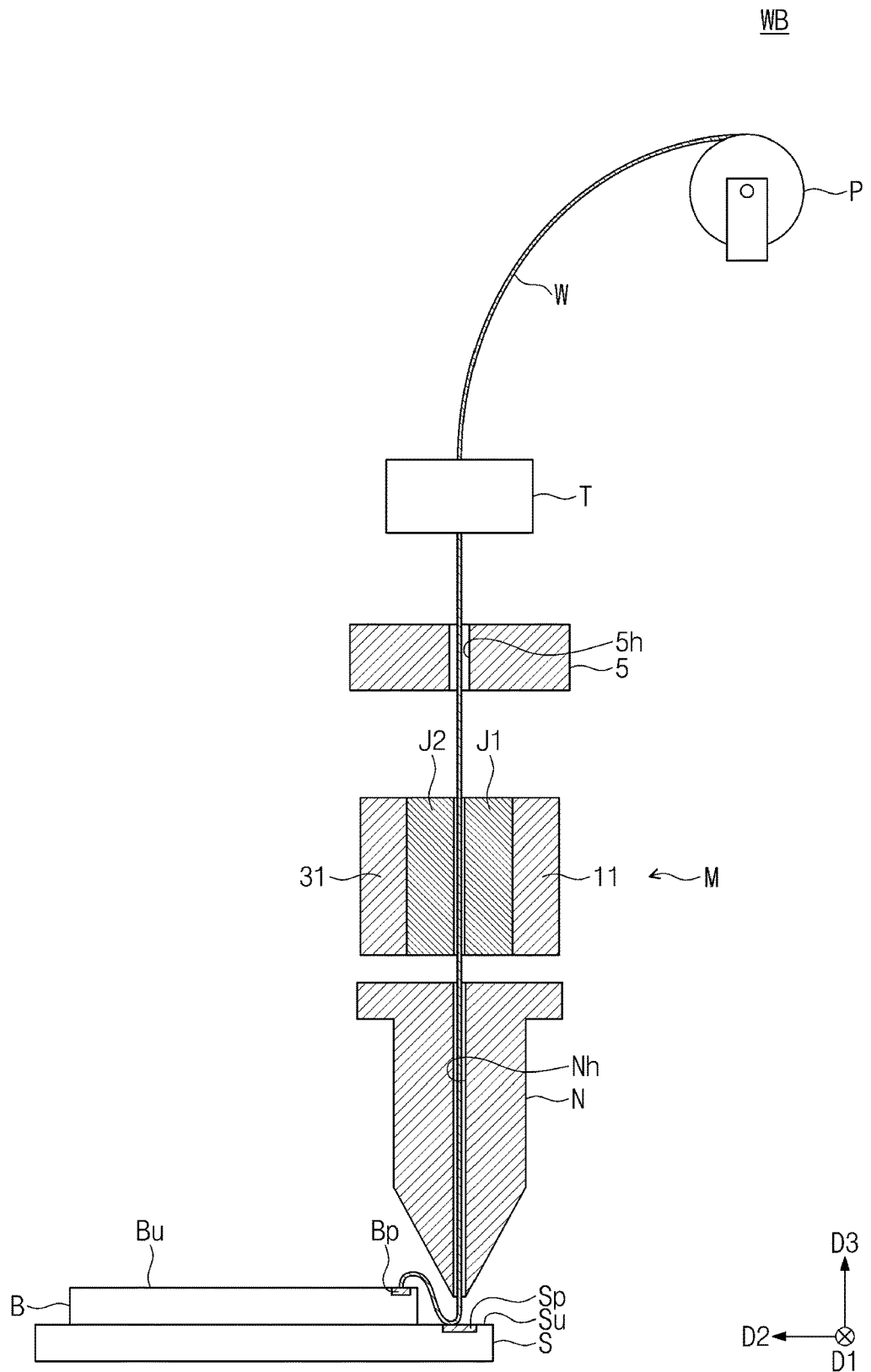
FIG. 2 illustrates a simplified diagram showing a cross-sectional view of a wire bonding apparatus that performs wire bonding according to some example embodiments of the present inventive concepts.

FIG. 2 illustrates a simplified diagram showing a wire bonding apparatus that performs wire bonding according to some example embodiments of the present inventive concepts.

Referring to FIG. 2, after the wire W is bonded to the chip pad Bp, the capillary N may move to a position such that the wire W may touch the substrate pad Sp. For example, while one side of the wire W is bonded to the chip pad Bp, other side of the wire W may be disposed on the substrate pad Sp. While the other side of the wire W is disposed on the substrate pad Sp, the wire W may be bonded to the substrate pad Sp. The procedure to bond the wire W to the substrate pad Sp may be substantially the same as or similar to the procedure to bond the wire W to the chip pad Bp.

Figure 3:
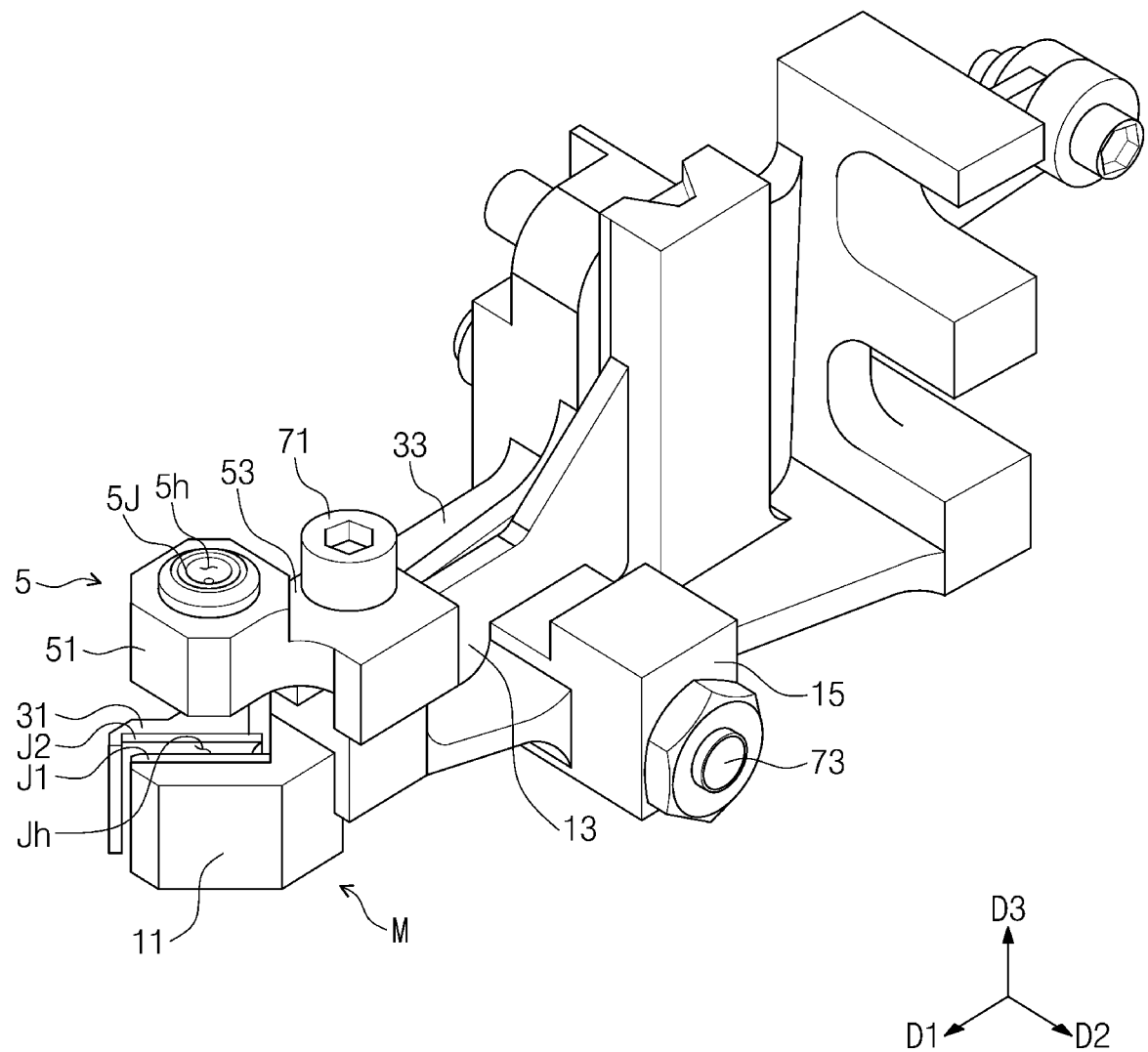
FIG. 3 illustrates a perspective view partially showing a wire bonding apparatus according to some example embodiments of the present inventive concepts.
Figure 4:
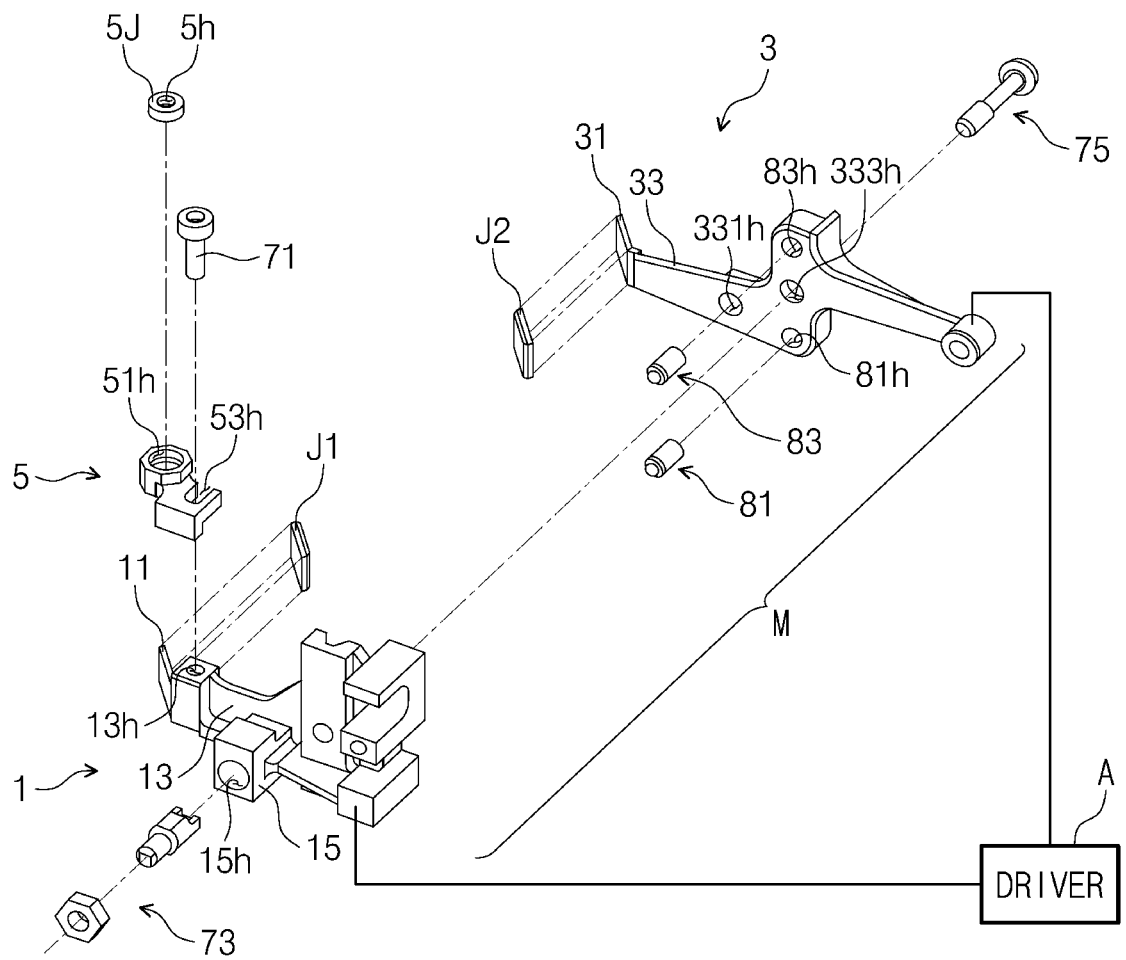
FIG. 4 illustrates an exploded perspective view partially showing a wire bonding apparatus according to some example embodiments of the present inventive concepts.
Figure 5:
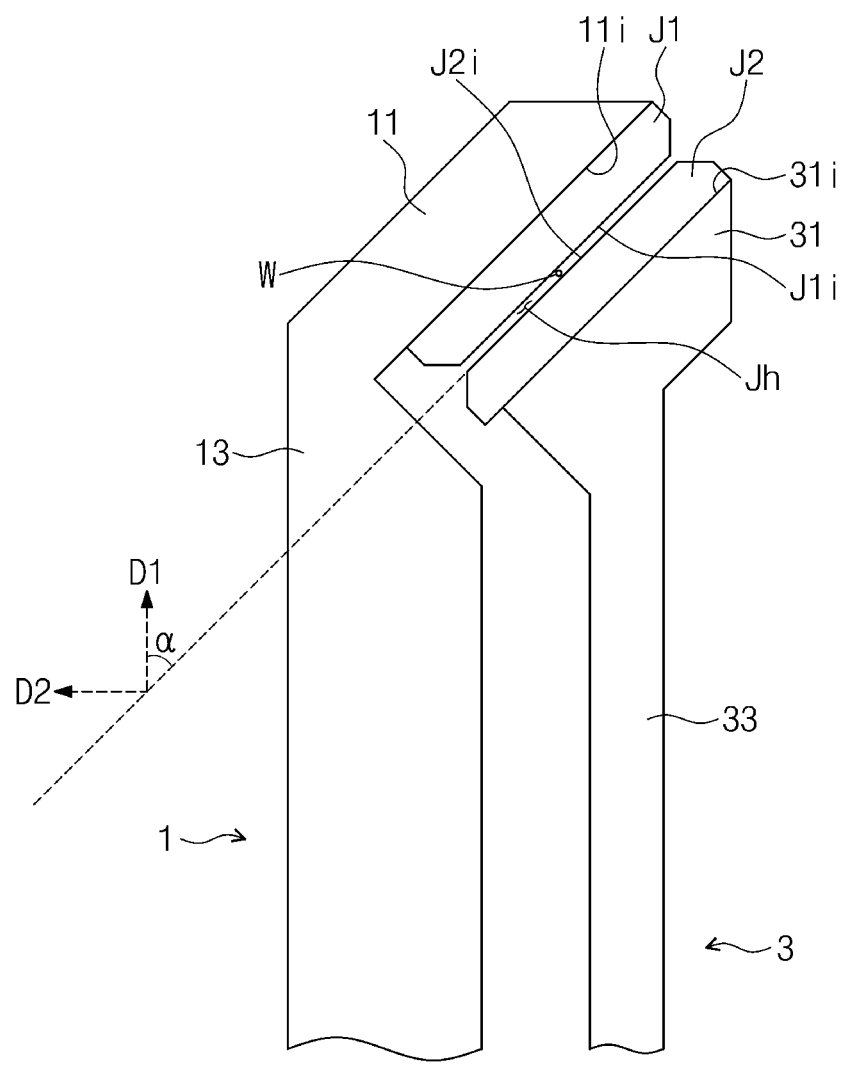
FIG. 5 illustrates an plan view partially showing a wire bonding apparatus according to some example embodiments of the present inventive concepts.

FIG. 3 illustrates a perspective view partially showing a wire bonding apparatus according to some example embodiments of the present inventive concepts. FIG. 4 illustrates an exploded perspective view partially showing a wire bonding apparatus according to some example embodiments of the present inventive concepts. FIG. 5 illustrates an plan view partially showing a wire bonding apparatus according to some example embodiments of the present inventive concepts.

Referring to FIGS. 3 to 5, the wire clamp assembly (see M of FIG. 4) may include a first member 1, a second member 3, a first contact member J1, and a second contact member J2. The wire clamp assembly M may be associated with a driver A. The driver A may move the wire clamp assembly M. The driver A may include an actuator, such as a motor, to move the wire clamp assembly M. The driver A may drive the wire clamp assembly M to move in the first direction D1 and the second direction D2. The driver A may be engaged with both the first member 1 and the second member 3.

The first member 1 and the second member 3 may be spaced apart from each other. For example, the first member 1 and the second member 3 may be spaced apart from each other in the second direction D2. The first member 1 and the second member 3 may be connected to each other through connection members 73 and 75. The connection members 73 and 75 may extend in the second direction D2. The connection members 73 and 75 may be operationally connected to one of the first and second members 1 and 3. For example, the first member 1 and the second member 3 may not be fixed to the ends of the connection members 73 and 75, but rather may be movable along the connection members 73 and 75 in an extending direction of the connection members 73 and 75. Resilient members 81 and 83 may be inserted between the first member 1 and the second member 3. The first member 1 and the second member 3 may provide resilient member insert holes 81$h$ and 83$h$. The resilient members 81 and 83 may be compressible in the second direction D2. An external force may reduce a distance in the second direction D2 between the first member 1 and the second member 3. For example, the driver A may provide the second member 3 with the external force to reduce the distance between the first member 1 and the second member 3. When the external force is released, restoration forces from the resilient members 81 and 83 may increase the distance in the second direction D2 between the first member 1 and the second member 3.

The first member 1 may include a first body 13, a first tilting member 11, and a coupler 15. The first body 13 may extend in the first direction D1. The first body 13 may be spaced apart from the second member 3. The first body 13 may provide a connection hole 13$h$. A fixing member 71 may be inserted into the connection hole 13$h$. The first tilting member 11 may extend from the first body 13. For example, the first tilting member 11 may extend from an end of the first body 13 at an acute angle relative to an extending direction of the first body 13. A detailed description thereof will be further discussed below. The coupler 15 may be connected to the first body 13. The coupler 15 may provide a coupling hole 15$h$. The connection member 73 may be inserted into the coupling hole 15$h$.

The second member 3 may include a second body 33 and a second tilting member 31. The second body 33 may extend in the first direction D1. The second body 33 may be spaced apart from the first body 13. For example, the first body 13 and the second body 33 may be spaced apart from each other in the second direction D2. The second body 33 may provide coupling holes 331$h$ and 333$h$. The connection members 73 and 75 may be inserted into the coupling holes 331$h$ and 333$h$. The second tilting member 31 may extend from the second body 33. For example, the second tilting member 31 may extend from an end of the second body 33 at an acute angle relative to an extending direction of the second body 33. The second tilting member 31 may be spaced apart from the first tilting member 11. A detailed description thereof will be further discussed below.

The first contact member J1 may be coupled to the first member 1. For example, the first contact member J1 may be coupled to the first tilting member 11. For example, the first contact member J1 may be coupled to an inner surface of the first tilting member 11. The first contact member J1 may extend in a direction the same as an extending direction of the inner surface of the first tilting member 11. A detailed description thereof will be further discussed below. The first contact member J1 may be in direct contact with the wire (see W of FIG. 1). The first contact member J1 may include a metal or sapphire, though the present disclosure is not necessarily limited thereto. The first contact member J1 may be spaced apart from the second contact member J2.

The second contact member J2 may be coupled to the second member 3. For example, the second contact member J2 may be coupled to the second tilting member 31. For example, the second contact member J2 may be coupled to an inner surface of the second tilting member 31. The second contact member J2 may extend in a direction the same as an extending direction of the inner surface of the second tilting member 31. A detailed description thereof will be further discussed below. The second contact member J2 may be in direct contact with the wire (see W of FIG. 1). The second contact member J2 may include a metal or sapphire, though the present disclosure is not necessarily limited thereto. The second contact member J2 may be spaced apart from the first contact member J1.

The support 5 may be coupled to the first member 1. For example, the support 5 may be coupled through the fixing member 71 to the first member 1. The support 5 may include a support body 51, a connection body 53, and a wire contact member 5J.

The support body 51 may provide a support through hole 51$h$. The support through hole 51$h$ may extend in the third direction D3. The wire contact member 5J may be inserted into the support through hole 51$h$.

The connection body 53 may connect the support body 51 to the first member 1. The connection body 53 may provide a fixing hole 53$h$. The fixing member 71 may be inserted into the fixing hole 53$h$ and the connection hole 13$h$, thereby by fixing the support 5 onto the first member 1.

The wire contact member 5J may be positioned in the support through hole 51$h$. The wire contact member 5J may provide a through hole 5$h$. The first contact member 5J may include a metal or sapphire, though the present disclosure is not necessarily limited thereto.

FIG. 5 illustrates an enlarged plan view partially showing a wire bonding apparatus according to some example embodiments of the present inventive concepts.

Referring to FIG. 5, the first contact member J1 may be coupled to an inner surface 11$i$ of the first tilting member 11. The first contact member J1 may extend in a direction the same as an extending direction of the first tilting member 11. For example, the first contact member J1 may extend in a direction the same as an extending direction of the inner surface 11$i$ of the first tilting member 11. The first contact member J1 may have an inner surface J1$i$ that also extends in a direction the same as the extending direction of the inner surface 11$i$ of the first tilting member 11. The inner surface J1$i$ of the first contact member J1 may make an acute angle relative to the extending direction of the first body 13. For example, when the first body 13 extends in the first direction D1, the extending direction of the inner surface J1$i$ of the first contact member J1 may extend at an acute angle $\alpha$ relative to the first direction D1. For example, the acute angle $\alpha$ between the first direction D1 and the extending direction of the inner surface J1$i$ of the first contact member J1 may be about 40 to 50 degrees. For example, the acute angle $\alpha$ between the first direction D1 and the extending direction of the inner surface J1$i$ of the first contact member J1 may be about 45 degrees.

The second contact member J2 may be coupled to an inner surface 31$i$ of the second tilting member 31. The second contact member J2 may extend in a direction the same as an extending direction of the second tilting member 31. For example, the second contact member J2 may extend in a direction the same as an extending direction of the inner surface 31$i$ of the second tilting member 31. The second contact member J2 may have an inner surface J2$i$ that also extends in a direction the same as the extending direction of the inner surface 31$i$ of the second tilting member 31. The inner surface J2$i$ of the second contact member J2 may make an acute angle relative to the extending direction of the second body 33. For example, when the second body 33 extends in the first direction D1, the extending direction of the inner surface J2*i* of the second contact member J2 may make the acute angle α relative to the first direction D1. For example, the acute angle α between the first direction D1 and the extending direction of the inner surface J2*i* of the second contact member J2 may be about 40 to 50 degrees. For example, the acute angle α between the first direction D1 and the extending direction of the inner surface J2*i* of the second contact member J2 may be about 45 degrees. The second contact member J2 may be spaced apart from the first contact member J1. Accordingly, a clamping space Jh may be provided between the second contact member J2 and the first contact member J1. The wire W may pass through the clamping space Jh. When viewed in plan, the clamping space Jh may have a width the same as or greater than a diameter of the wire W.

Figure 6:
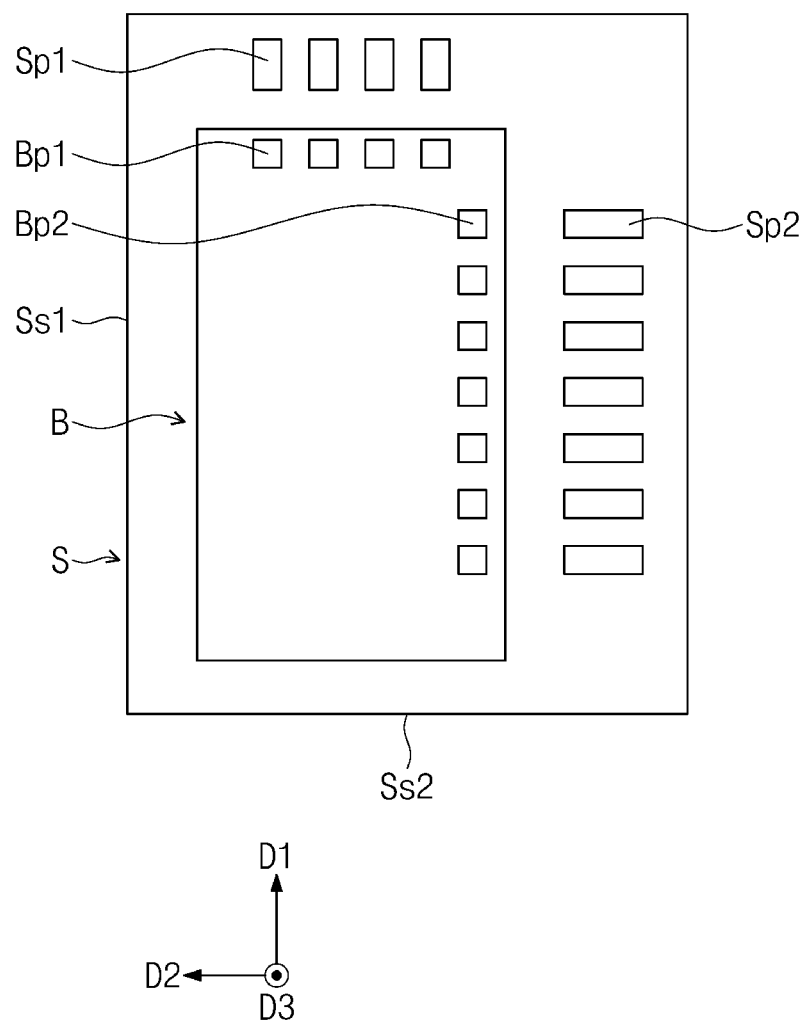
FIG. 6 illustrates a plan view showing a semiconductor package on which wire bonding is performed with a wire bonding apparatus according to some example embodiments of the present inventive concepts.

FIG. 6 illustrates a plan view showing a semiconductor package on which wire bonding is performed with a wire bonding apparatus according to some example embodiments of the present inventive concepts.

Referring to FIG. 6, a semiconductor package may include a substrate S and a semiconductor chip B. The substrate S may have a surface Ss1 parallel to the first direction D1. The substrate S may have a surface Ss2 parallel to the second direction D2. The substrate S may include a first substrate pad Sp1 and a second substrate pad Sp2. Each of the first and second substrate pads Sp1 and Sp2 may be provided as a plurality of substrate pads. In some example embodiments, the plurality of first substrate pads Sp1 may be spaced apart from each other in the second direction D2. The plurality of second substrate pads Sp2 may be spaced apart from each other in the first direction D1. The semiconductor chip B may include a first chip pad Bp1 and a second chip pad Bp2. Each of the first and second chip pads Bp1 and Bp2 may be provided as a plurality of chip pads. In some example embodiments, the plurality of first chip pads Bp1 may be spaced apart from each other in the second direction D2. The plurality of second chip pads Bp2 may be spaced apart from each other in the first direction D1. For convenience of description, the first substrate pad Sp1, the second substrate pad Sp2, the first chip pad Bp1, and the second chip pad Bp2 will each be explained below in singular number.

A wire may be required to connect the first substrate pad Sp1 to the first chip pad Bp1. The first substrate pad Sp1 and the first chip pad Bp1 may be spaced apart from each other in the first direction D1.

A wire may be required to connect the second substrate pad Sp2 to the second chip pad Bp2. The second substrate pad Sp2 and the second chip pad Bp2 may be spaced apart from each other in the second direction D2.

FIGS. 7 to 12 illustrate plan views showing wire bonding performed with a wire bonding apparatus according to some example embodiments of the present inventive concepts.

Figure 7:
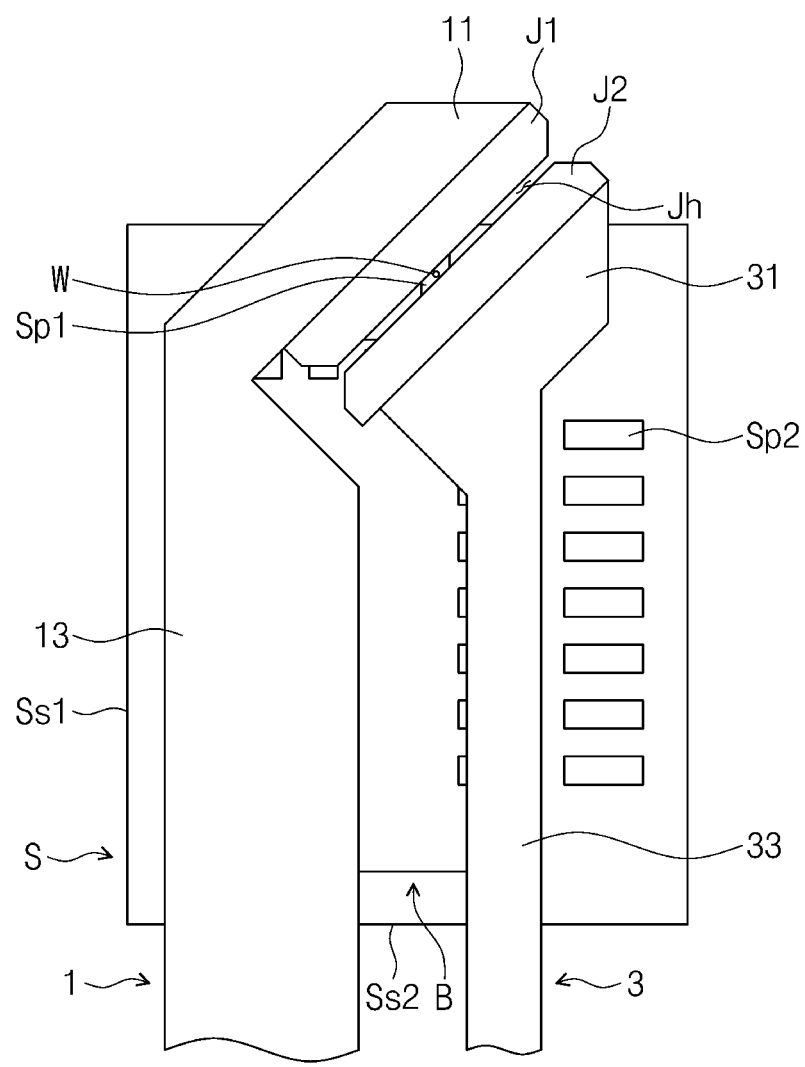
FIGS. 7 to 12 illustrate plan views showing wire bonding performed with a wire bonding apparatus according to some example embodiments of the present inventive concepts.
Figure 7:
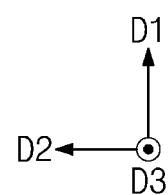

Referring to FIG. 7, the wire W may pass through between the first contact member J1 and the second contact member J2. The first and second contact members J1 and J2 may be disposed on the first substrate pad Sp1. Therefore, the wire W between the first and second contact members J1 and J2 may be positioned on the first substrate pad Sp1. The wire W may be bonded to the first substrate pad Sp1. This may be achieved through the bonding process discussed with reference to FIGS. 1 and 2.

Figure 8:
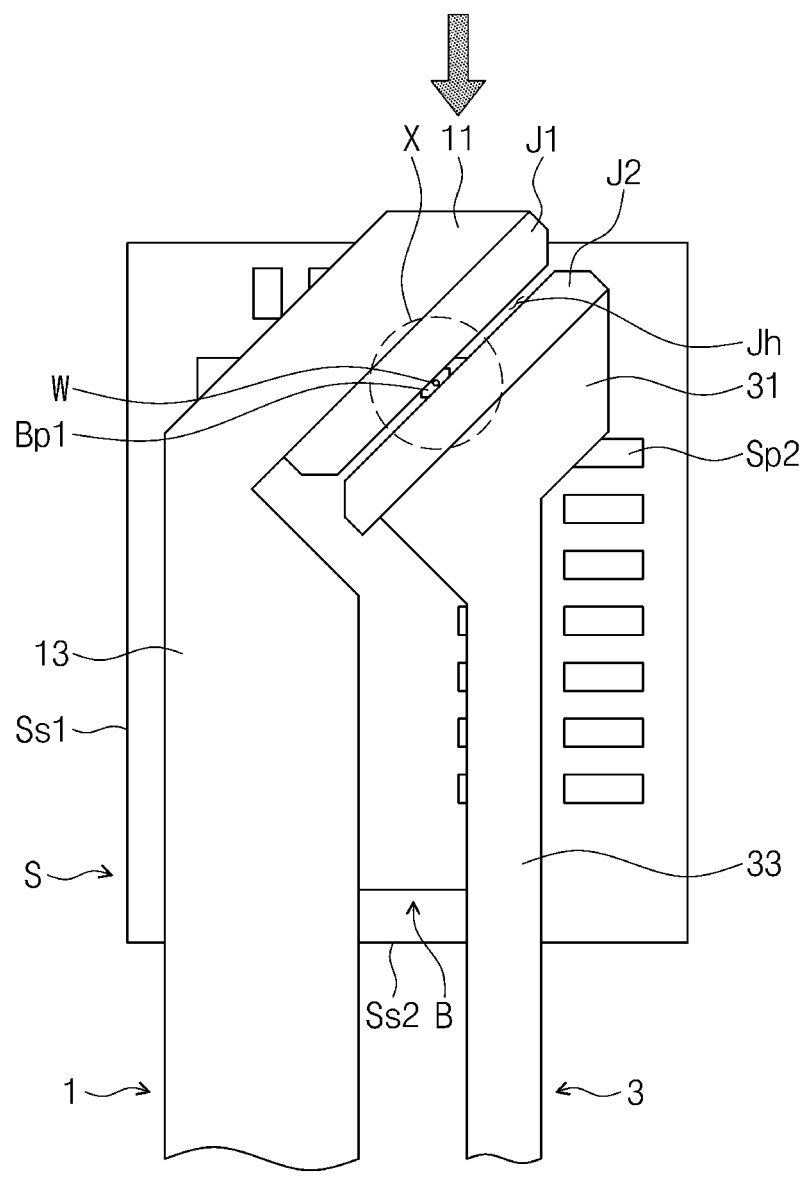

Referring to FIG. 8, when an end of the wire W is bonded to the first substrate pad (see Sp1 of FIG. 7), the first and second members 1 and 3 may move in a direction opposite to the first direction D1. The motion of the first and second members 1 and 3 may move the wire W provided between the first contact member J1 and the second contact member J2. For example, the wire W may shift when the capillary (see N of FIGS. 1 and 2) and the support (see 5 of FIGS. 1 and 2) move together with the first and second members 1 and 3, below which the capillary N is disposed and above which the support 5 is disposed. This procedure may release the wire W wound on the wire spool (see P of FIGS. 1 and 2). The first member 1 and the second member 3 may move until the wire W becomes positioned on the first chip pad Bp1.

Figure 9:
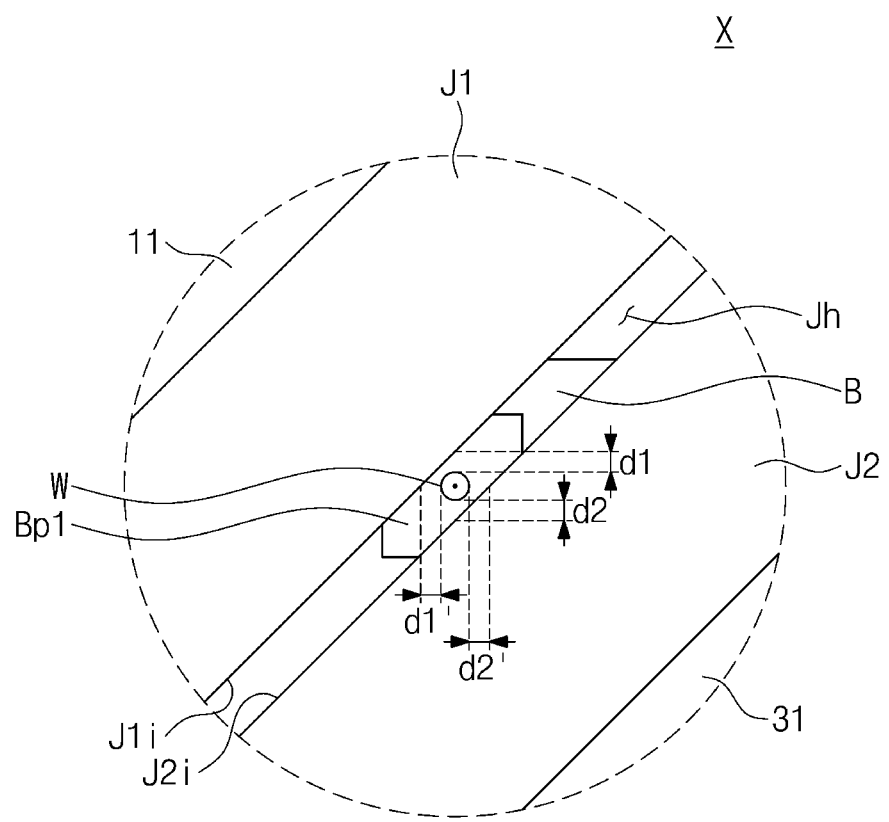

Referring to FIG. 9, a first interval d1 may refer to a distance in the first direction D1 between the wire W and the inner surface J1*i* of the first contact member J1. A second interval d2 may refer to a distance in the first direction D1 between the wire W and the inner surface J2*i* of the second contact member J2. The first and second contact members J1 and J2 may extend at an acute angle relative to the first direction D1 and the second direction D2. The clamping space Jh between the first and second contact members J1 and J2 may extend at an acute angle relative to the first direction D1 and the second direction D2. In an example embodiment, the first and second members 1 and 3 may move to guide the wire in a direction that forms an acute angle with the extending direction of the clamping space Jh, and accordingly, the first and second intervals d1 and d2 may be relatively small. In this case, even when the first and second contact members J1 and J2 move in the first direction D1, the clamping space Jh may provide the wire W with a relatively small distance in which the wire W can shift without being limited by the first contact member J1 or the second contact member J2. As a result, the wire W may be prevented from unwanted movement in the first direction D1. A detailed description thereof will be further discussed below with reference to FIGS. 13 and 14.

A third interval d1' may be provided as a distance in the second direction D2 between the wire W and the inner surface J1*i* of the first contact member J1. A fourth interval d2' may be provided as a distance in the second direction D2 between the wire W and the inner surface J2*i* of the second contact member J2. The third and fourth intervals d1' and d2' may be respectively similar to the first and second intervals d1 and d2.

Figure 10:
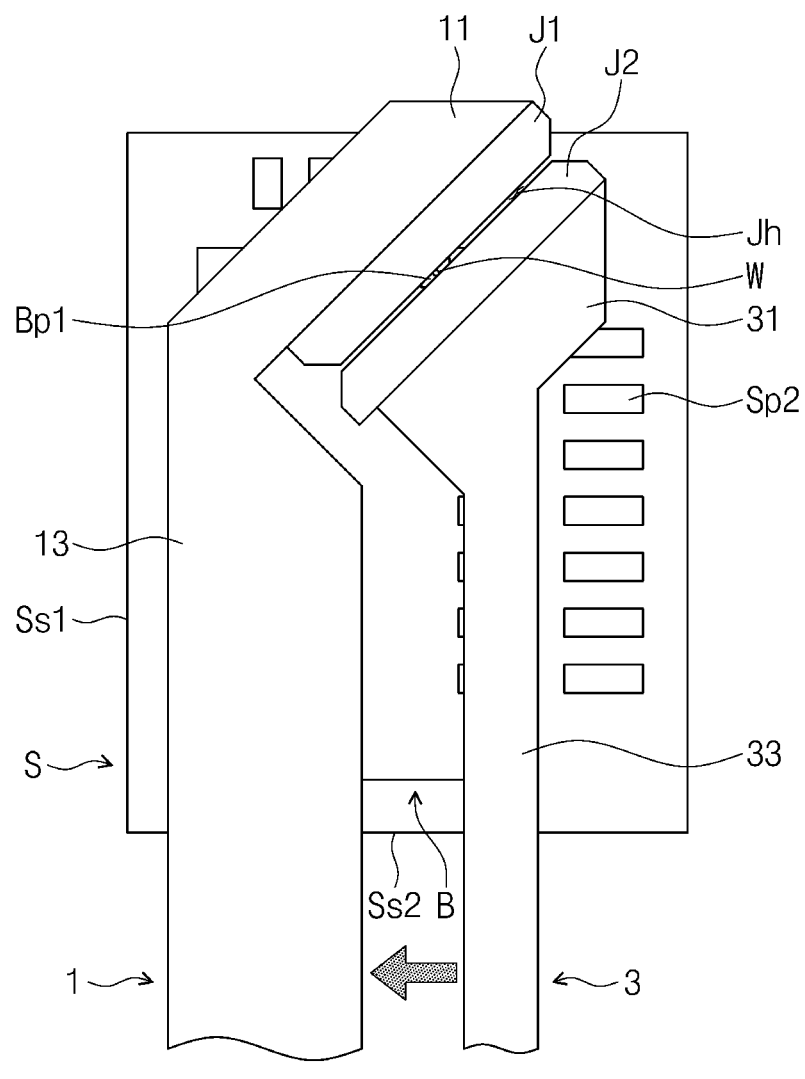
Figure 10:
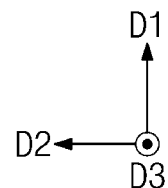

Referring to FIG. 10, when the wire W is positioned on the first chip pad Bp1, the second member 3 may move in the second direction D2. Therefore, the first member 1 and the second member 3 may become positioned closer together. For example, there may be a reduction in distance in the second direction D2 between the first contact member J1 and the second contact member J2. The first and second contact members J1 and J2 may compress opposite sides of the wire W, and the wire W may be fixed on its position. While the wire W is fixed on its position, a bonding process may be performed as discussed with reference to FIGS. 1 and 2. The wire W may be bonded to the first chip pad Bp1. Accordingly, the first chip pad Bp1 and the first substrate pad Sp1 may be electrically connected to each other through the wire W.

Figure 11:
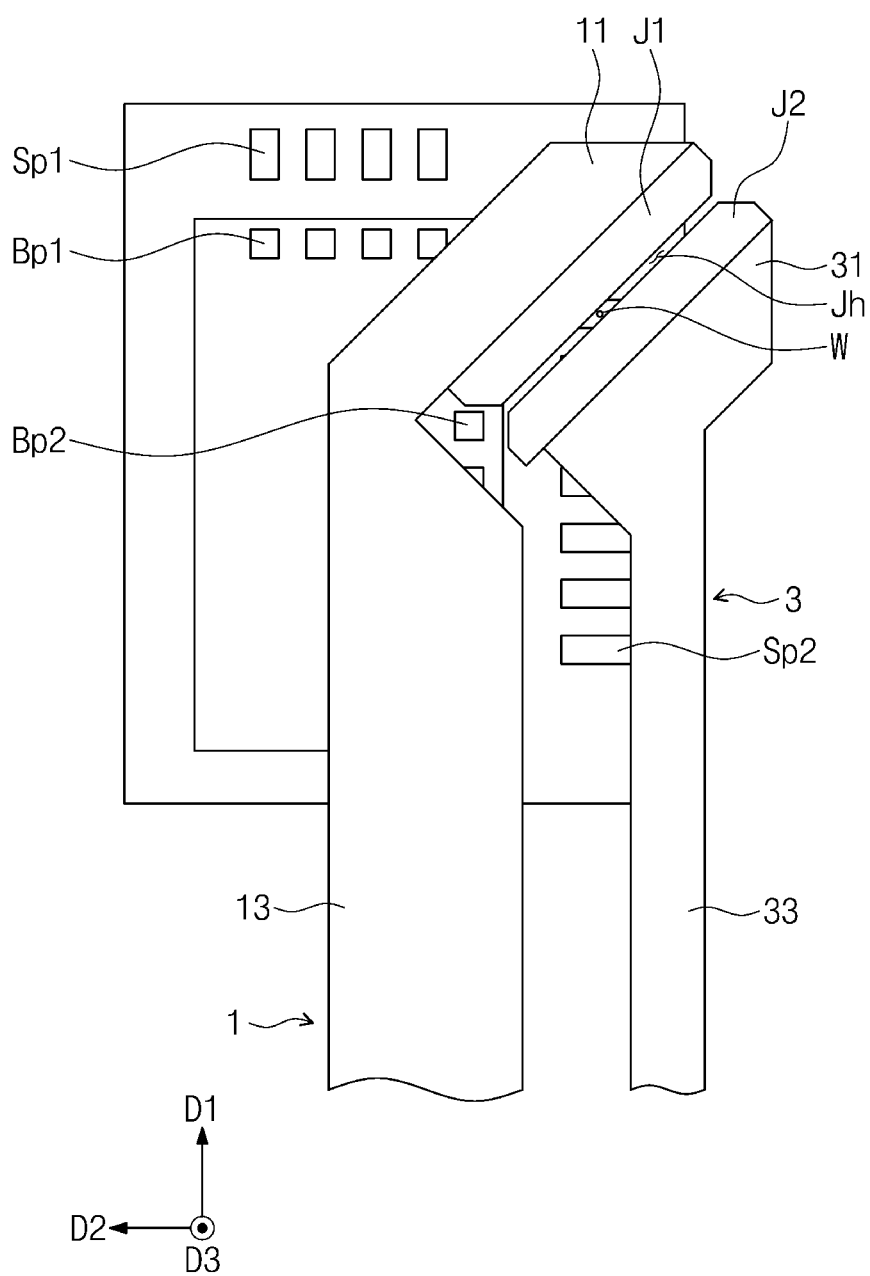

Referring to FIG. 11, the first contact member J1 and the second contact member J2 may be positioned above the second chip pad Sp2. Therefore, the wire W between the first and second contact members J1 and J2 may be positioned on the second substrate pad Sp2. The wire W may be bonded to the second substrate pad Sp2. This may be achieved through the bonding process discussed with reference to FIGS. 1 and 2.

Figure 12:
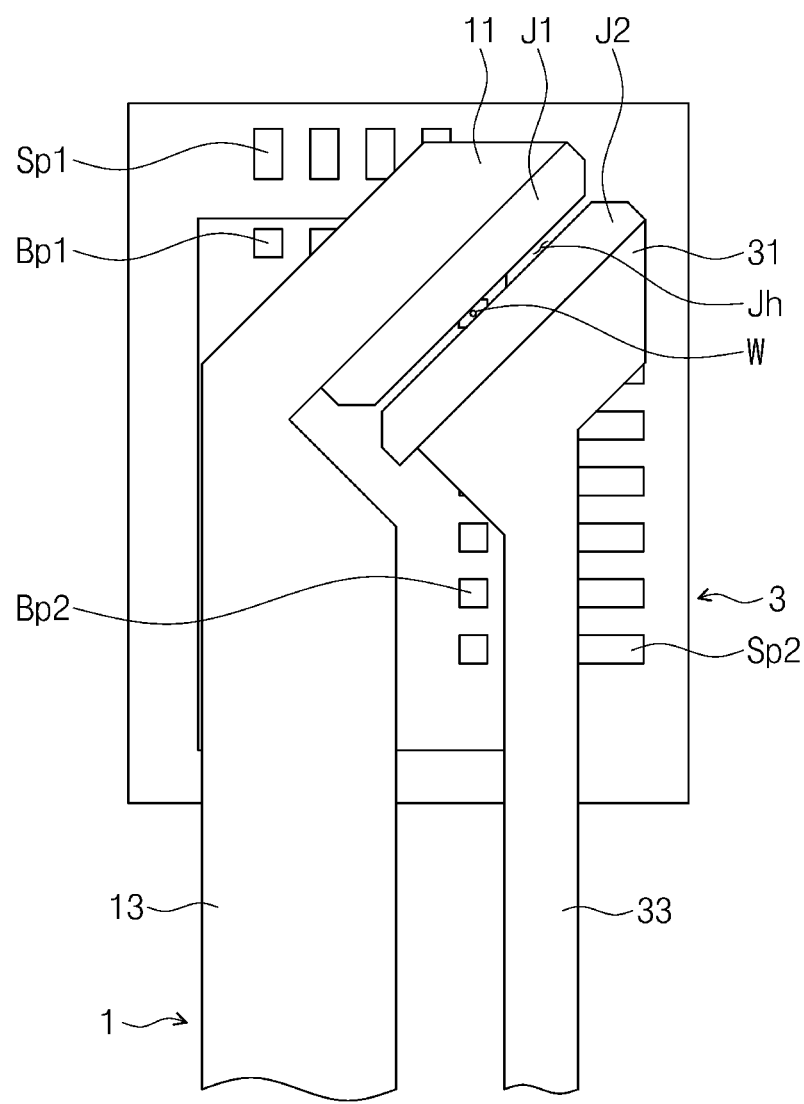

Referring to FIG. 12, when an end of the wire W is bonded to the second substrate pad Sp2, the first member 1 and the second member 3 may move in the second direction D2. The motion of the first and second members 1 and 3 may move the wire W provided between the first contact member J1 and the second contact member J2. For example, the wire W may shift when the capillary (see N of FIGS. 1 and 2) and the support (see 5 of FIGS. 1 and 2) move together with the first and second members 1 and 3, below which the capillary N is disposed and above which the support 5 is disposed. This procedure may release the wire W wound on the wire spool (see P of FIGS. 1 and 2). The first member 1 and the second member 3 may move until the wire W becomes positioned on the second chip pad Bp2.

Referring back to FIG. 9, the third and fourth intervals d1' and d2' may be relatively small. In example embodiments, there are many directions for movement of the first and second members 1 and 3 such that the direction forms an acute angle with the extending direction of either contact member J1 or J2, and in such cases, the distance intervals d1, d2, d1', and d2' may be small. For example, even when the first and second contact members J1 and J2 move in the second direction D2, the clamping space Jh may provide the wire W with a relatively small distance in which the wire W can shift without being limited by the first contact member J1 or the second contact member J2. As a result, the wire W may be prevented from unwanted movement in the second direction D2.

Figure 13:
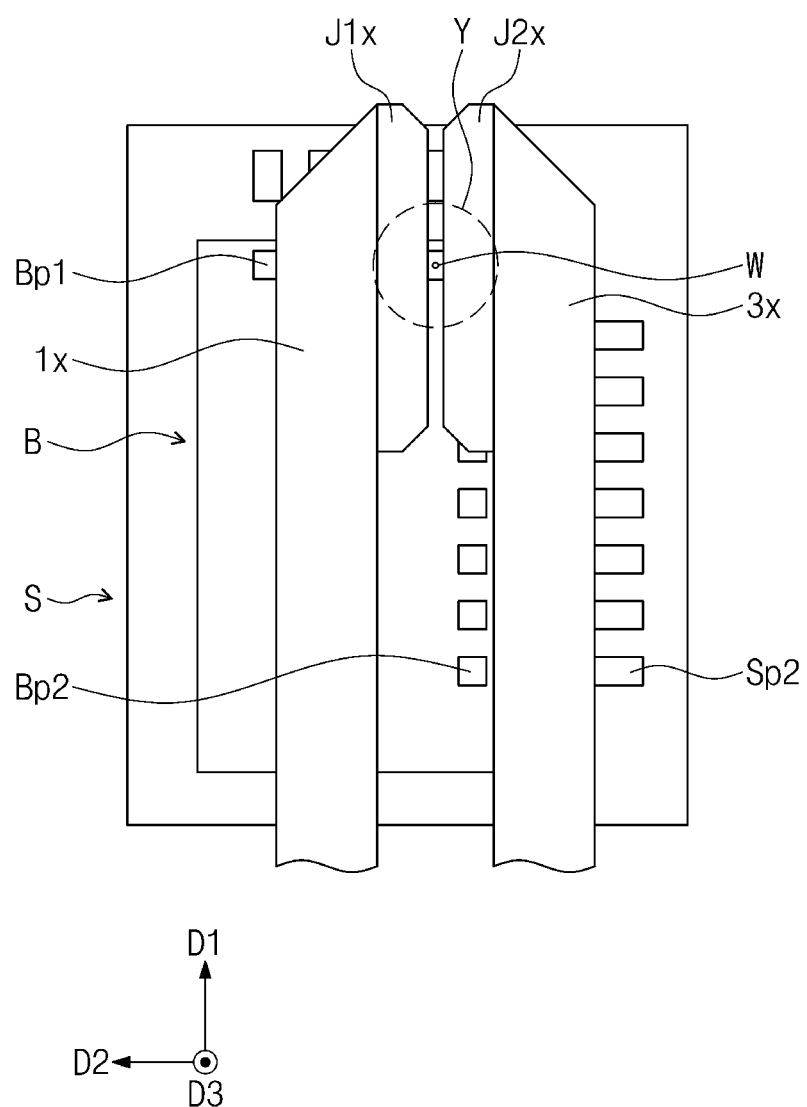
FIGS. 13 and 14 illustrate plan views showing wire bonding performed with a wire bonding apparatus according to comparative examples.
Figure 14:
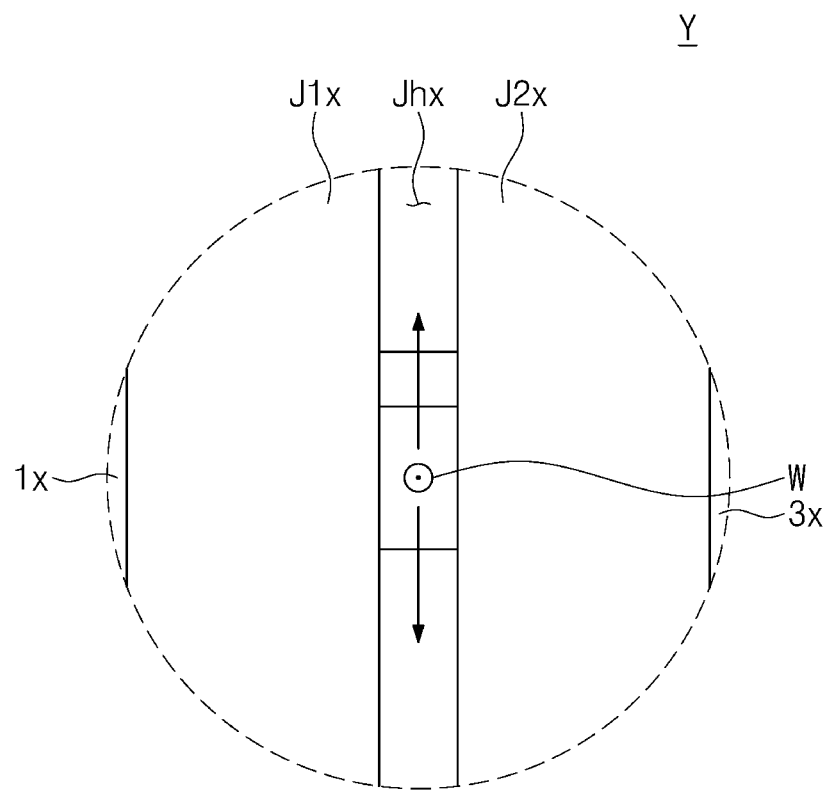

FIGS. 13 and 14 illustrate plan views showing wire bonding performed with a wire bonding apparatus according to comparative examples.

Referring to FIG. 13, a first member 1x may extend only in the first direction D1. Therefore, a first contact member J1x may also extend only in the first direction D1. A second member 3x may extend only in the first direction D1. Therefore, a second contact member J2x may also extend only in the first direction D1.

Referring to FIG. 14, a clamping space Jhx may extend long in the first direction D. Therefore, the wire W may freely move in the first direction D1 in the clamping space Jhx. When the first and second members 1x and 3x move in the first direction D1, the wire W may violently swing in the first direction D1 in the clamping space Jhx. The swinging movement of the wire W may reduce accuracy of wire bonding.

According to the wire bonding apparatus in accordance with some example embodiments of the present inventive concepts, a wire may be prevented from unnecessarily shifting in the middle of movement of a wire clamp assembly. When the wire is prevented from swinging movement, it may be possible to exactly direct a trajectory of the wire. In addition, it may also be possible to prevent the wire from unintentionally contacting a conductive material. In this case, the wire may be suppressed from short. Thus, the wire bonding process may increase in accuracy and reliability. As a result, the semiconductor package may increase in yield.

Figure 15:
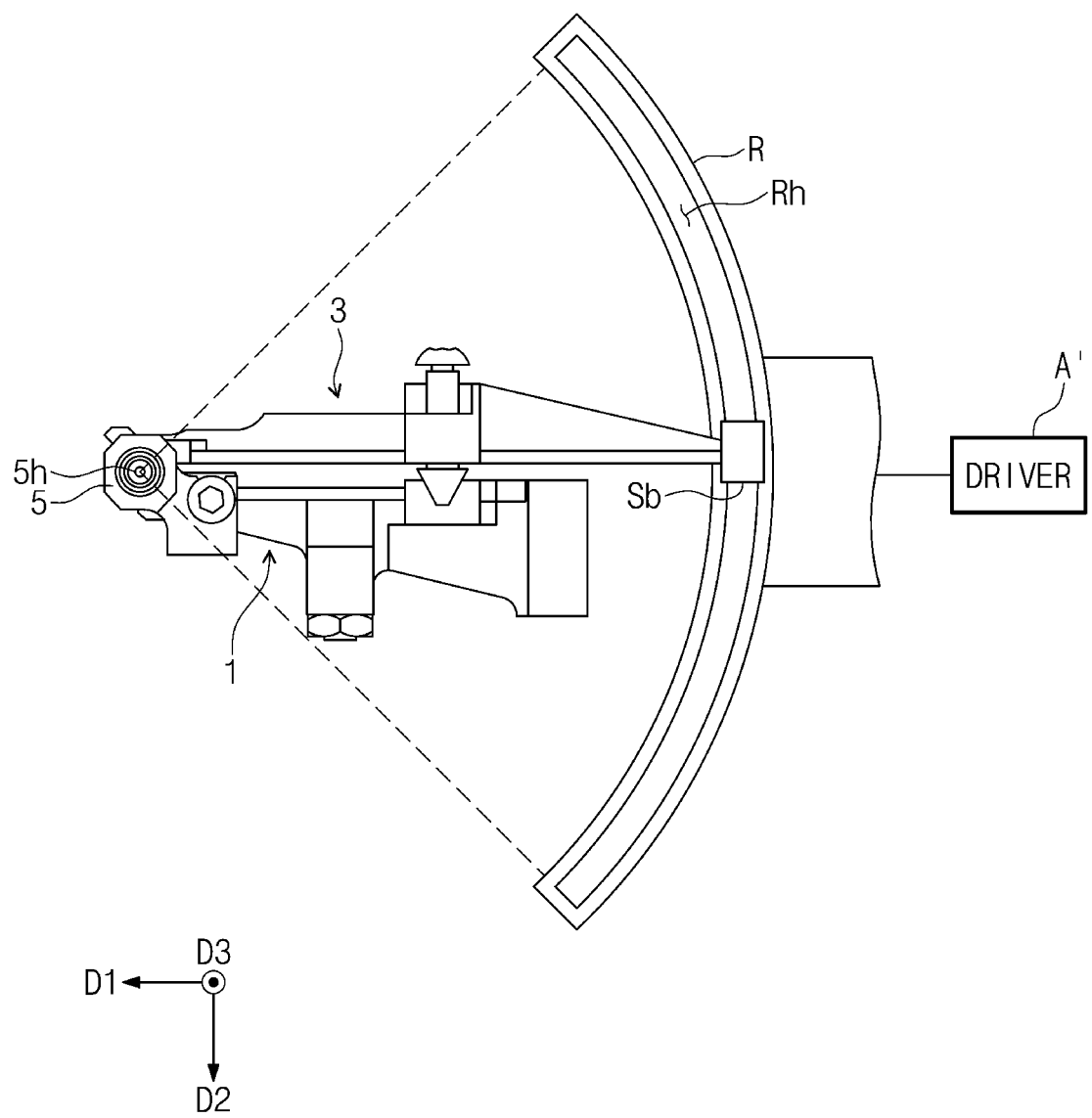
FIGS. 15 and 16 illustrate plan views showing a wire bonding apparatus according to some example embodiments of the present inventive concepts.
Figure 16:
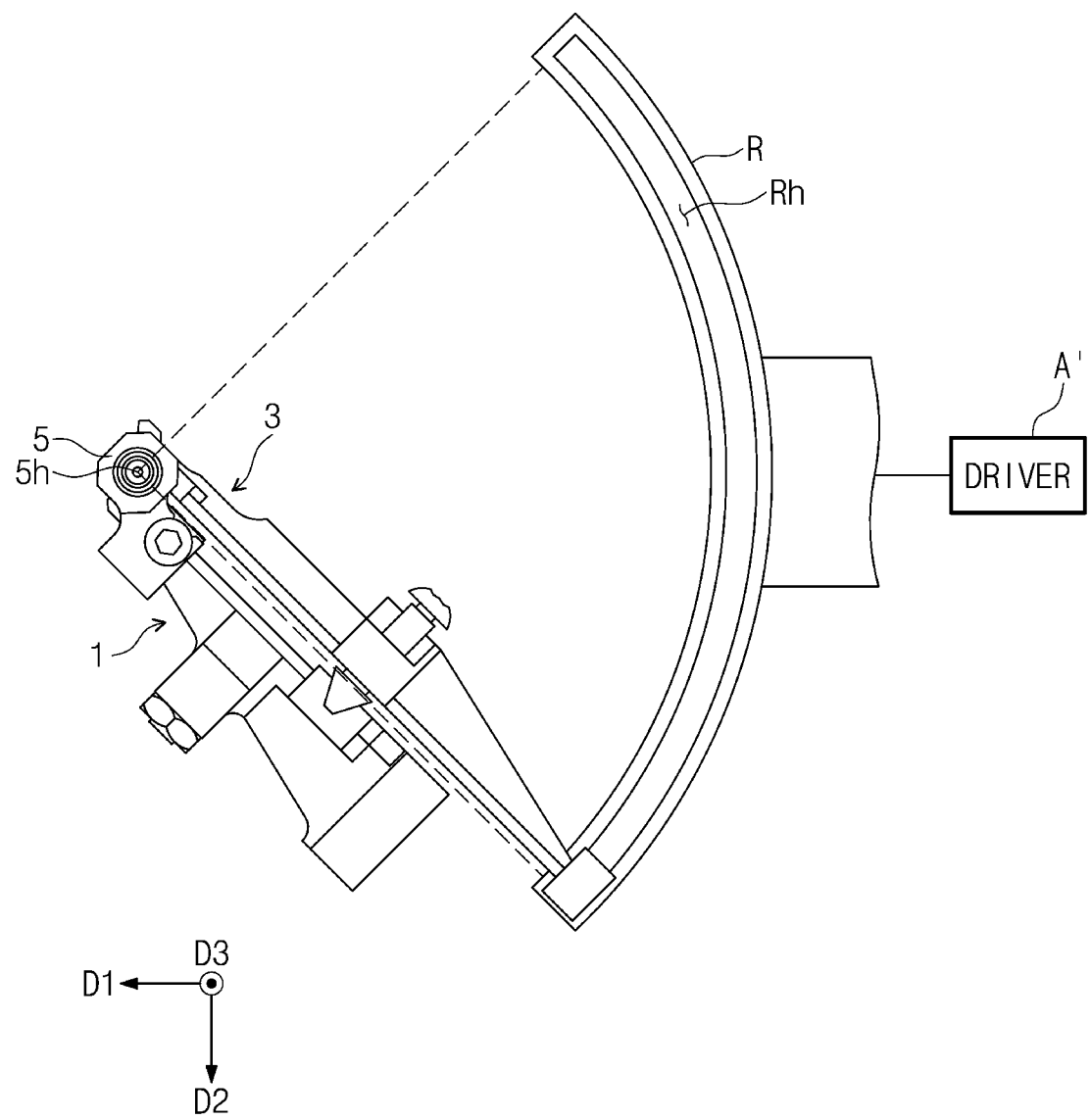

FIGS. 15 and 16 illustrate plan views showing a wire bonding apparatus according to some example embodiments of the present inventive concepts.

In the embodiments that follow, the description of features substantially the same as or similar to those discussed with reference to FIGS. 1 to 14 may be omitted for convenience of explanation.

Referring to FIG. 15, the wire bonding apparatus may further include a slide rail R. The slide rail R may provide a slide hole Rh. The slide hole Rh may have an arc shape. For example, the slide hole Rh may form an arc shape whose center of curvature is occupied by the through hole 5h through which a wire may pass. The first member 1 and/or the second member 3 may be slidably coupled to the slide hole Rh. For example, the first member 1 and/or the second member 3 may be slidably coupled through a slide block Sb to the slide hole Rh.

Referring to FIG. 16, the slide rail R may be associated with a driver A'. The driver A' may drive the slide rail R to move in the first direction D1 and the second direction D2. In addition, the driver A' may drive the first member 1 and/or the second member 3 to rotate along the slide hole Rh. The first member 1 and/or the second member 3 may be rotatable around the through hole 5h.

Figure 17:
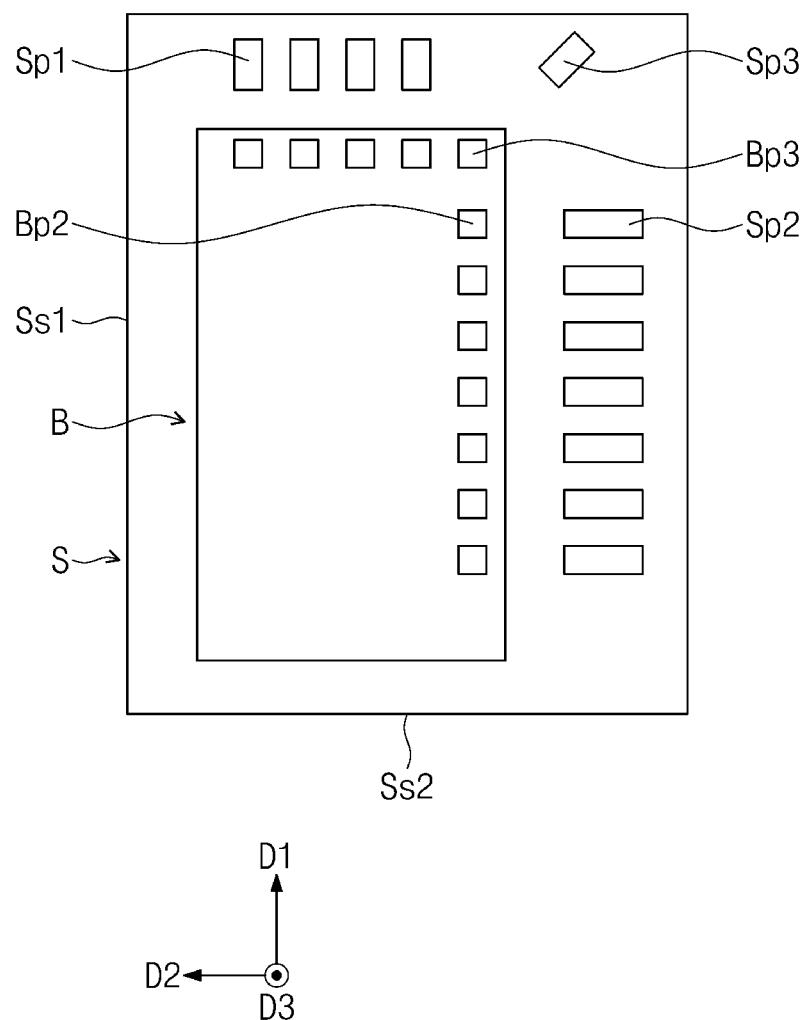
FIGS. 17 and 18 illustrate plan views showing wire bonding performed with a wire bonding apparatus according to some example embodiments of the present inventive concepts.
Figure 18:
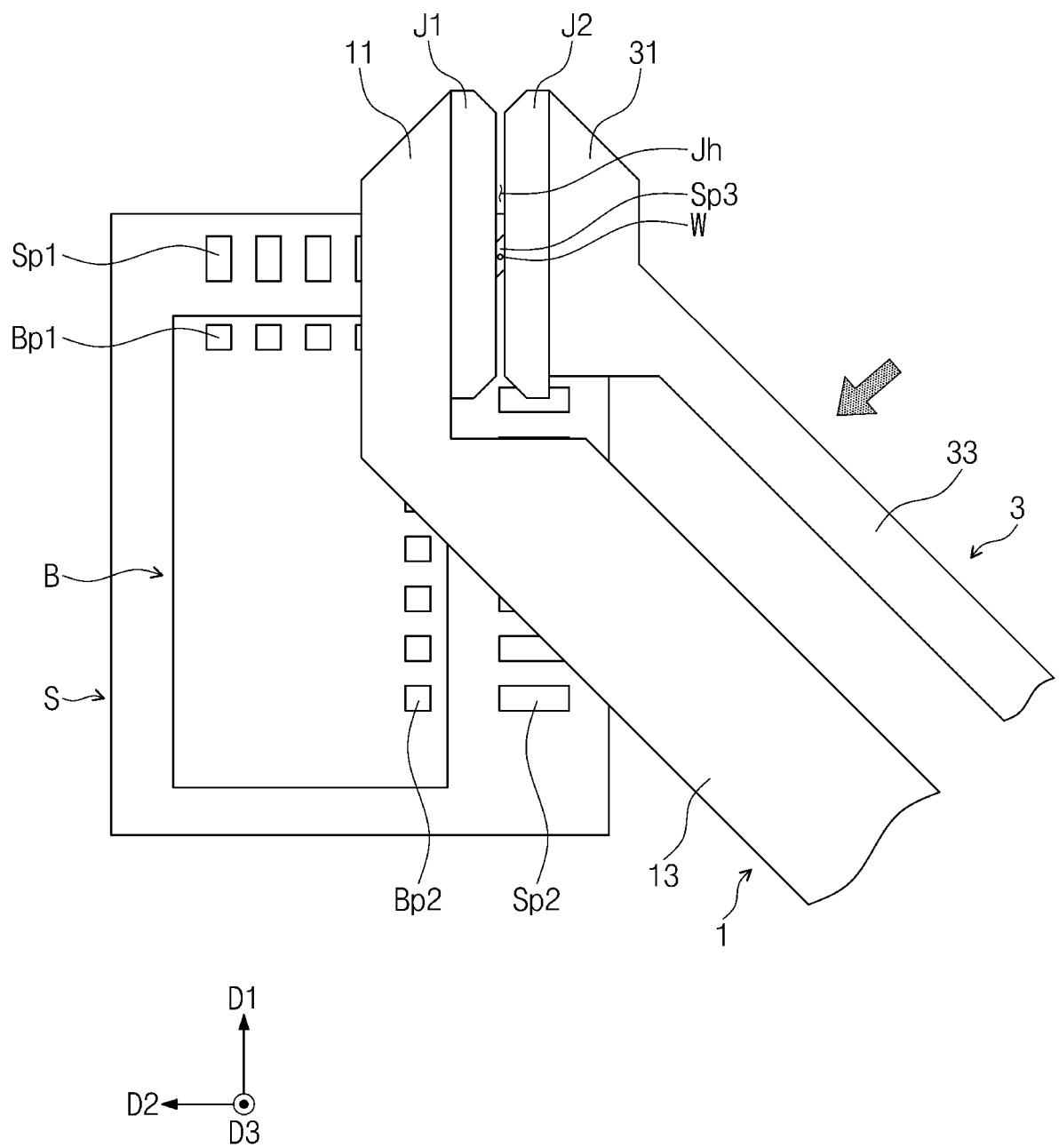

FIGS. 17 and 18 illustrate plan views showing wire bonding performed with a wire bonding apparatus according to some example embodiments of the present inventive concepts.

Referring to FIG. 17, the substrate S of the semiconductor package may include a third substrate pad Sp3. The semiconductor chip B may include a third chip pad Bp3. A wire may be required to connect the third substrate pad Sp3 to the third chip pad Bp3. The third substrate pad Sp3 may be spaced apart from the third chip pad Bp3 in a direction that makes an acute angle relative to the first direction D1 and the second direction D2.

Referring to FIG. 18, the first member 1 and the second member 3 may allow the wire W to rest on the third substrate pad Sp3. The wire W may be required to move in a diagonal direction toward the third chip pad (see Bp3 of FIG. 17). As discussed with reference to FIG. 16, the first member 1 and the second member 3 may rotate to cause the clamping space Jh to extend in the first direction D1. Therefore, even when the first and second members 1 and 3 move in a diagonal direction, the clamping space Jh may still extend in the first direction D1, and accordingly the wire W may be prevented from swinging movement in the clamping space Jh.

According to some example embodiments of the present inventive concepts, the wire bonding apparatus may be configured to rotate a wire clamp assembly. When the wire bonding apparatus moves at various angles, the wire clamp assembly may rotate corresponding to the movement of the wire bonding apparatus. For example, the wire clamp assembly may rotate corresponding to a moving direction of the wire bonding apparatus, and therefore the wire may be prevented from swinging movement in the wire clamp assembly during the movement of the wire bonding apparatus. Accordingly, even when the wire bonding apparatus moves at various angles, the wire bonding may increase in accuracy.

According to the wire bonding apparatus in accordance with some example embodiments of the present inventive concepts, the wire clamp assembly may rotate in a state without moving a position of the wire. Therefore, the wire may stably maintain its position even if the wire claim assembly rotates during the wire bonding. Thus, it may be possible at any time to stably perform a rotation of the wire clamp assembly. Accordingly, it may be possible to reduce the time required for the wire bonding.

Figure 19:
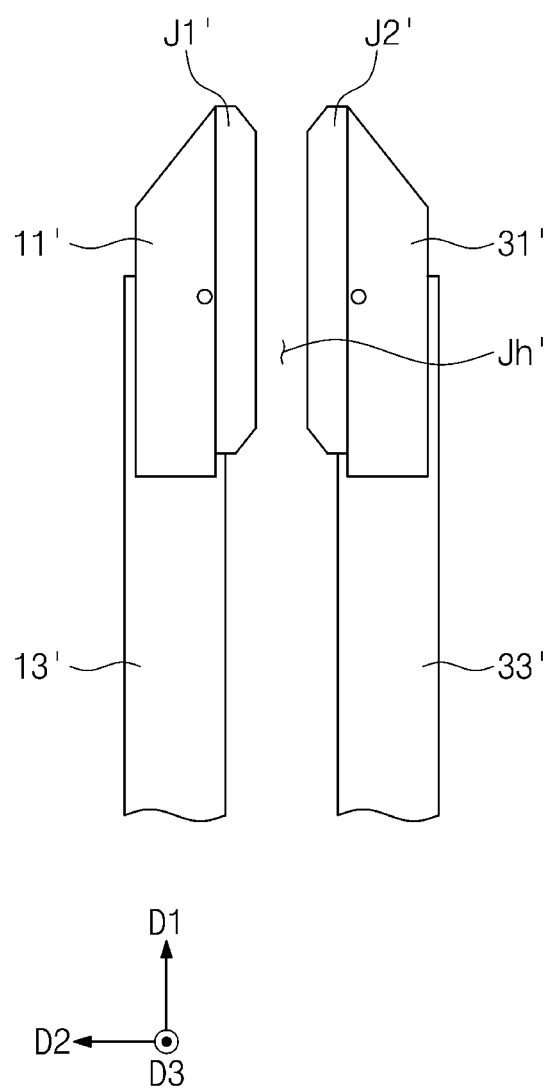
FIGS. 19 and 20 illustrate enlarged plan views partially showing a wire bonding apparatus according to some example embodiments of the present inventive concepts.
Figure 20:
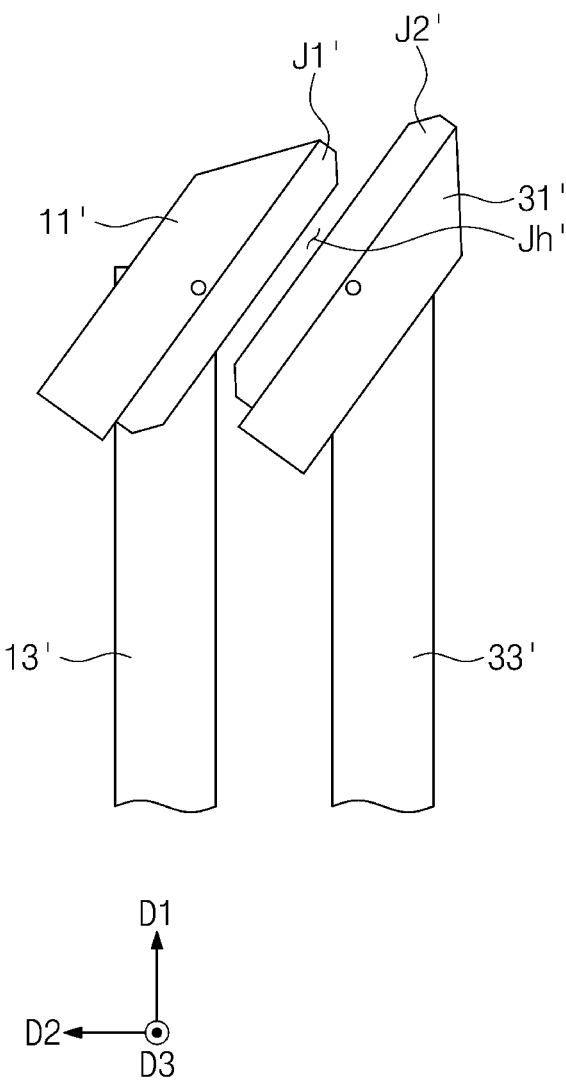

FIGS. 19 and 20 illustrate enlarged plan views partially showing a wire bonding apparatus according to some example embodiments of the present inventive concepts.

In the embodiments that follow, the description of features substantially the same as or similar to those discussed with reference to FIGS. 1 to 18 may be omitted for convenience of explanation.

Referring to FIGS. 19 and 20, a first tilting member 11' may be rotatable with respect to a first body 13'. For example, the first tilting member 11' may be rotatable with respect to the first body 13' about a rotation axis that extends in the third direction D3. Therefore, a first contact member Jr may also be rotatable with respect to the first body 13'. A second tilting member 31' may be rotatable with respect to a second body 33'. For example, the second tilting member 31' may be rotatable with respect to the second body 33' about a rotation axis that extends in the third direction D3. Therefore, a second contact member J2' may also be rotatable with respect to the second body 33'. Accordingly, an extending direction of a clamping space Jh' may be rotatable.

The wire bonding apparatus of the present inventive concepts may suppress swinging movement of wires.

The wire bonding apparatus of the present inventive concepts may increase a yield of wire bonding.

The wire bonding apparatus of the present inventive concepts may increase a yield of wire bonding performed at various angles.

Effects of the present inventive concepts are not limited to the mentioned above, other effects which have not been mentioned above will be clearly understood to those skilled in the art from the following description.

Although the present inventive concepts have been described in connection with the embodiments of the present inventive concepts illustrated in the accompanying drawings, it will be understood to those skilled in the art that various changes and modifications may be made without departing from the technical spirit and essential features of the present inventive concepts. It therefore will be understood that the embodiments described above are illustrative but not limitative in all aspects.

What is claimed is:

1. A wire bonding apparatus, comprising:
a capillary that extrudes a wire;
a wire clamp assembly disposed on the capillary;
a support disposed on the wire clamp assembly;
a wire contact member; and
a slide rail that provides a slide hole,
wherein the wire clamp assembly includes:
a first member;
a second member spaced apart from the first member;
a first contact member coupled to the first member; and
a second contact member coupled to the second member and spaced apart from the first contact member,
wherein the first member includes:
a first body that extends in a first direction; and
a first tilting member that extends at an acute angle relative to the first direction,
wherein the second member includes:
a second body that extends in the first direction and is spaced apart from the first body in a second direction; and
a second tilting member that extends at the acute angle relative to the first direction and is spaced apart from the first tilting member,
wherein the first contact member is coupled to an inner surface of the first tilting member and extends in an extending direction of the first tilting member,
wherein the second contact member is coupled to an inner surface of the second tilting member and extends in an extending direction of the second tilting member, and
wherein the second member is movable in the second direction,
wherein the support is coupled to an upper side of the wire clamp assembly and provides a support through hole that extends in a third direction intersecting the first and second directions,
wherein the wire contact member is inserted into the support through hole,
wherein the wire contact member provides a through hole
wherein the slide hole forms an arc shape whose center of curvature is located within the through hole of the wire contact member, and
wherein the wire clamp assembly is slidably coupled to the slide hole.

2. The wire bonding apparatus of claim 1, wherein the wire clamp assembly is rotatable.

3. The wire bonding apparatus of claim 1, wherein the wire clamp assembly is coupled through a slide block to the slide hole.

4. A wire bonding apparatus, comprising:
a capillary that extrudes a wire;
a wire clamp assembly disposed on the capillary; and
a support disposed on the wire clamp assembly,
wherein the wire clamp assembly includes:
a first member;
a second member spaced apart from the first member;
wherein the first member includes:
a first body that extends in a first direction; and
a first tilting member that extends at an acute angle relative to the first direction,
wherein the second member includes:
a second body that extends in the first direction and is spaced apart from the first body in a second direction; and
a second tilting member that extends at the acute angle relative to the first direction and is spaced apart from the first tilting member,
wherein the second member is movable in the second direction, and
wherein the wire clamp assembly is rotatable.

5. The wire bonding apparatus of claim 4, further comprising:
a first contact member coupled to the first member; and
a second contact member coupled to the second member and spaced apart from the first contact member,
wherein the first contact member is coupled to an inner surface of the first tilting member and extends in an extending direction of the first tilting member, and
wherein the second contact member is coupled to an inner surface of the second tilting member and extends in an extending direction of the second tilting member.

6. The wire bonding apparatus of claim 5, wherein each of the first and second contact members includes sapphire.

7. The wire bonding apparatus of claim 5, wherein the first member and the second member are connected to each other through a resilient member.

8. The wire bonding apparatus of claim 5, wherein the support is coupled to an upper side of the wire clamp assembly and provides a support through hole that extends in a third direction intersecting the first and second directions.

9. The wire bonding apparatus of claim 5, further comprising a wire contact member inserted into the support through hole,
wherein the wire contact member provides a through hole.

10. The wire bonding apparatus of claim 9, wherein the wire contact member includes sapphire.

11. The wire bonding apparatus of claim 10, further comprising a slide rail that provides a slide hole,
wherein the slide hole forms an arc shape whose center of curvature is located within the through hole of the wire contact member, and
wherein the wire clamp assembly is slidably coupled to the slide hole.

12. The wire bonding apparatus of claim 11, wherein the wire clamp assembly is coupled through a slide block to the slide hole.

13. The wire bonding apparatus of claim 5, further comprising a wire tensioner on the support.

* * * * *